United States Patent [19]

Baccini

[11] Patent Number: 6,109,323
[45] Date of Patent: Aug. 29, 2000

[54] DEVICE TO WITHDRAW, SUPERIMPOSE AND ANCHOR FOILS FOR GREEN-TAPE CIRCUITS

[76] Inventor: Gisulfo Baccini, Via Duca d'Aosta 1, Mignagola Di Carbonera (TV), Italy, 31010

[21] Appl. No.: 08/082,782

[22] Filed: Jun. 28, 1993

[30] Foreign Application Priority Data

Jul. 7, 1992 [IT] Italy ................................ UD92A0122

[51] Int. Cl.⁷ .................................................. B32B 35/00
[52] U.S. Cl. ........................... 156/378; 156/362; 156/556
[58] Field of Search ..................... 156/362, 363, 156/364, 378, 556, 557, 580.1, 584; 198/506, 507, 514, 517

[56] References Cited

U.S. PATENT DOCUMENTS

| | | | |
|---|---|---|---|
| 4,149,925 | 4/1979 | Mintz | 156/362 X |
| 4,599,122 | 7/1986 | Nakamura | 156/378 X |
| 5,314,711 | 5/1994 | Baccini . | |
| 5,449,409 | 9/1995 | Baccini . | |

FOREIGN PATENT DOCUMENTS 2 113 189   8/1983   United Kingdom .

OTHER PUBLICATIONS

Anzelone et al.; IBM Tech. Disclosure Bulletin, vol. 20, No. 11B, Apr. 1978; Handler with Transfer and Tray Orientor.

Cochran et al.; IBM Tech. Disclosure Bulletin, vol. 20, No. 11B, Apr. 1978; "Stacking Complex".

*Primary Examiner*—Curtis Mayes
*Attorney, Agent, or Firm*—Nixon & Vanderhye P.C.

[57] ABSTRACT

Device to withdraw, superimpose and anchor foils for green-tape circuits, which cooperates with a plurality of containers (15) of supports (16) of single characterised green-tape foils (11), each container (15) holding green-tape foils (11) characterised in the same manner as each other, each container (15) having at least one withdrawal side that can be rendered unusable momentarily by closure means (19), the containers (15) being arranged in an organised manner at least along one side cooperating with conveyor means (27) and with movable carriage means (12) that withdraw the supports (16) in a programmed manner, the conveyor means (27) cooperating at least with means that remove the green-tape foils (11) from the supports (16) and with support discharge means (48), alignment means (39) and superimposing and anchorage means (42).

21 Claims, 6 Drawing Sheets

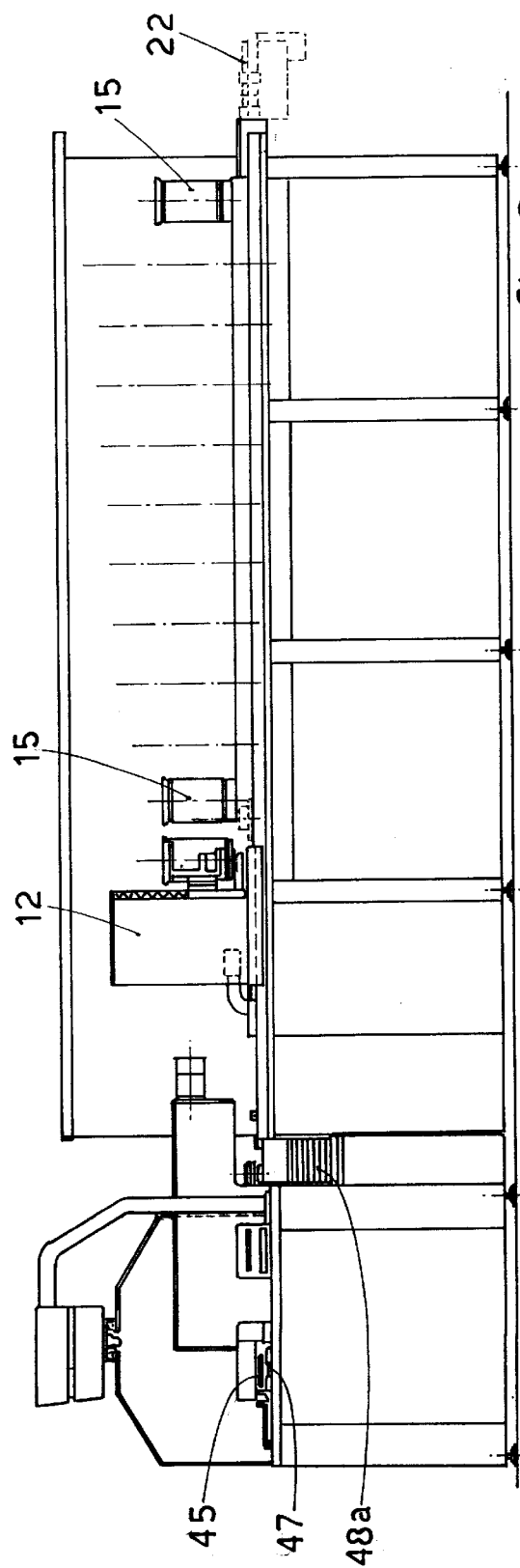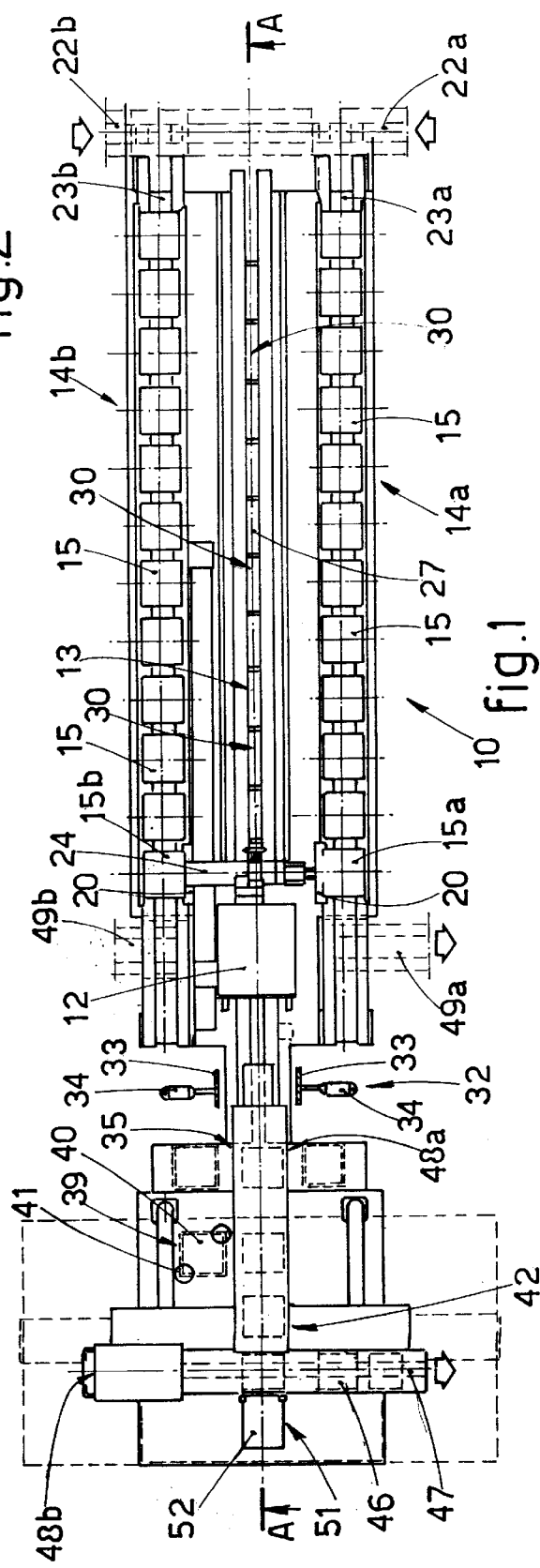

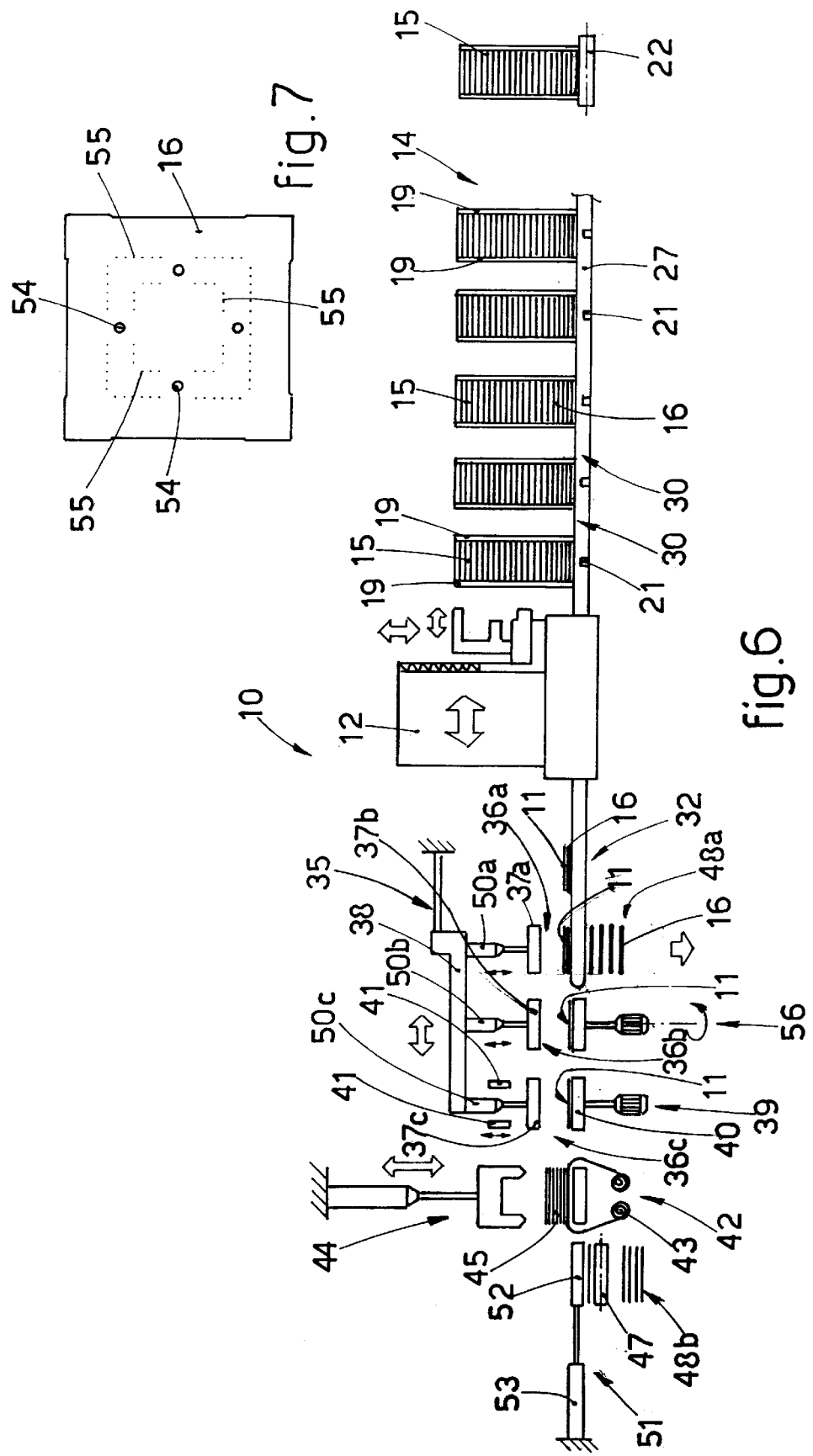

DEVICE TO WITHDRAW, SUPERIMPOSE AND ANCHOR FOILS FOR GREEN-TAPE CIRCUITS

BACKGROUND OF THE INVENTION

Field of the Invention

This invention concerns a device to withdraw, superimpose and anchor foils for green-tape circuits, as set forth in the main claim.

SUMMARY OF THE INVENTION

To be more exact, the invention concerns a device suitable to withdraw, one by one in a pre-set sequence, supports in the form of plates, each of which supports a thin foil of the type employed in green-tape circuits; these supports are arranged in appropriate containers positioned substantially side by side and each container is characterised by holding a particular type of green tape foil.

We shall speak in the text hereinafter of green-tape foils and shall mean thereby foils consisting of ceramics prefired at a low temperature and containing glass fibres and possessing designed properties of viscosity and temperature, the foils consisting also of refractory materials used as fillers so as to be able to comply with the coefficient of thermal expansion of the alumina.

The invention is applied to foils which are supplied mounted on a thin film of MYLAR polyester acting as a separator between the foil and its support and are marketed by Du Pont under the name Green Tape, and is applied also to any other type of analogous foil possessing like properties and marketed by other companies under other names.

The device according to the invention therefore conveys the supports and the relative green-tape foils to at least one alignment station so as to position the green-tape foils correctly in view of a subsequent superimposing of the foils on each other so as to form a multi-layer pack.

The green-tape foils thus superimposed in a well defined order and forming a multi-layer pack are then anchored together to form one single whole, for instance by adhesives, or advantageously, but not only, by the anchorage system disclosed in Italian patent application No. UD91A000156 filed in the name of the present applicant, or by a microwave welding system, or by an ultrasonic welding system, or else by any other anchorage system suitable for the purpose.

The device according to the invention can be employed also to handle other analogous products in the form of flexible foils which require a stiff plate-type support for their handling.

Hybrid circuits in the so-called green-tape technology consist of thin foils of alumina in the raw state or of other analogous or similar materials; the foils have a printed circuit on one or both of their two faces and the various circuits are connected together through small holes.

These green-tape or analogous foils are superimposed on each other in a number amounting even to some tens and are then anchored together and compressed to produce a multi-layer pack of a slender thickness.

This step entails the problem of having to withdraw in an ordered manner the suitably supported individual green-tape foils from their respective containers and to superimpose them on each other before the anchorage operation.

The handling of these green-tape foils involves a set of drawbacks since the foils have a thickness of the order of 0.1–0.5 mm. and possess no rigidity; they therefore require a support for their handling.

Moreover, if an acceptable finished product is to be made, the superimposing of the green-tape foils on each other to form a multi-layer pack has to comply with a tolerance of 5 microns, and this makes the orientation and alignment very difficult.

The operation of anchoring the green-tape foils together can be carried out by applying an adhesive to the edges of each foil forming the green-tape circuit or else, as we said above, with a welding process, such as that, for instance, disclosed in Italian patent application No. UD91A000156 (corresponding to U.S. Ser. No. 07/931,330 filed Aug. 18, 1992, now U.S. Pat. No. 6,017,410) filed in the name of the present applicant, or with any other anchorage system.

Any reciprocal sliding between the green-tape foils forming the multi-layer pack of the circuit is thus obviated and the multi-layer packs are then sent forward to the successive compression step.

The problems which the invention is intended to overcome are therefore, in short, as follows: the organised storage of the various green-tape circuits; withdrawal thereof in a programmed sequence from the store; the orientation and reciprocal alignment of the various circuits; and the reciprocal anchorage of the various circuits.

The present applicant has studied, tested and embodied this invention over a long time so as to overcome these problems and to achieve further advantages.

This invention is set forth and characterized in the main claim, while the dependent claims describe variants of the idea of the main embodiment.

The invention provides a fully automated device to withdraw, superimpose and anchor green-tape foils, the device being able to set in order and position a plurality of containers.

The containers have the purpose of holding, positioning and conveying in a desired manner supports which have the form of a thin plate or consist of thin plates; the plates possess finished perimetric measurements and a square or rectangular or, more generally, determined polygonal plan.

The supports, which may also have irregular sides, always possess at least two sides which, as regards their conformation, can be considered as being parallel sides.

The container consists of a pallet that acts as a lower base, to which are fitted lateral containing and positioning sidewalls, and of an upper cover that joins the sidewalls.

The containers have two loading and withdrawal faces arranged at 180° to each other and symmetrical; the supports are loaded and withdrawn through these faces.

The sidewalls are parallel to each other and include in their opposed surfaces a plurality of grooves into which the supports are inserted.

The grooves are positioned in such a way that the supports inserted therein lie on planes substantially parallel to the plane on which the pallet lies.

The sidewalls are caused to cooperate with guides included in the pallet and are fastened in the required positions, thus determining the inner width between the sidewalls. A cover is solidly fixed to the sidewalls.

Storage codes and/or identification plaques may be fitted to the pallet and will cooperate with code readers and code writers in providing correct organisation of the information available from the system.

The grooves include lead-ins in their initial portions so as to assist insertion of the supports in the surfaces determined by the various grooves in the opposed faces of the container.

To prevent the supports leaving the grooves independently, the grooves may be interrupted at one end or may be free at both ends. Mechanical closure means are positioned at the free end or ends.

These mechanical closure means can be operated mechanically or by hand to open the grooves and to enable the supports to be withdrawn or inserted by a mere linear thrusting or drawing action.

The mechanical closure means may be included at only one edge of a sidewall or at both edges of a sidewall.

The mechanical closure means are actuated resiliently so that, unless they are actuated, they keep the grooves closed and can act either at the outer edge of the grooves or within the grooves.

The mechanical closure means obstruct momentarily the exit of the supports present in the grooves.

The pallet below can be of any type and will therefore be made individually suitable for the typical conveyor device with which it has to cooperate. The pallet will contain advantageously, but not necessarily, a vertical central space.

According to a variant means are included in the upper cover to apply momentarily a handle to enable the containers to be handled and conveyed by hand when necessary.

According to another variant alignment means are provided on the cover and are employed for the correct positioning of engagement means when the containers have to be withdrawn and conveyed by automatic means.

According to the invention the pallet includes guides which cooperate with recesses in the lower part of the sidewalls; these guides, by means of clamping means, secure the pallet firmly to the sidewalls and fix the sidewalls in position.

The inclusion of these guides enables a very wide range of reciprocal positionings, not constrained beforehand, to be arranged for the sidewalls and pallet so as to make the width of the container suitable for the dimensions of the support to be held and positioned correctly.

Each of the containers holds a plurality of rigid supports, each of which bears a green-tape foil; each container holds a specific type of green-tape foil.

The rigid supports contain openings to identify the presence of a green-tape foil and also a plurality of small holes arranged in a part of their surface. These small holes have the task of keeping the green-tape foil on the support when a negative pressure is created below the support or of lifting the green-tape foil from the support when air under pressure is blown upwards from below through the support.

The invention provides for the device to include means able to withdraw in sequence in a pre-set manner a required plurality of supports with their relative green-tape foils; each support is taken from a specific container.

The withdrawal means according to the invention take the relative green-tape foil from its support and convey that foil in the same sequential order as that of its withdrawal to a first alignment station and to a second superimposing and anchorage station, in which the green-tape foils are anchored together, at least foil upon foil.

According to a variant the support together with its relative green-tape foil cooperates with a pre-alignment station before the alignment station.

The device according to the invention uses containers in which a plurality of rigid-plate type supports, on each of which is laid a green-tape foil, are superimposed above one another and are suitably distanced.

The containers are fed to the device according to the invention in sequence in a determined order and are clamped in a pre-set position to form at least one row, in which the withdrawal sides of the containers are all turned towards the same side of the row.

According to a variant the containers are arranged so as to form two parallel and possibly symmetrical rows.

According to another variant the containers are arranged to form two parallel rows staggered in relation to each other.

The device according to the invention comprises a carriage able to move to and fro and to cooperate with the withdrawal sides of the containers.

When there are two parallel rows of containers, the carriage can run along a central lane defined by the two rows of containers positioned at the sides thereof, and the withdrawal side of the containers faces that central lane.

The carriage can move step by step and is positioned in a programmed manner opposite each pre-selected container.

An opener means fitted to the carriage cooperates with the mechanical closure means, which close resiliently at least partly the withdrawal side of the containers facing the movable carriage.

When the mechanical closure means have been rendered inactive, it is possible to withdraw supports from the relative container.

Where there are two parallel rows of containers, the movable carriage at each position of its dwell is positioned advantageously in alignment with two containers respectively positioned to the right and to the left of its direction of movement.

At least one vertically positionable withdrawal means is fitted to the movable carriage and can move on a substantially horizontal plane in a direction perpendicular to the direction of movement of the movable carriage.

Where there are two parallel rows of containers, the withdrawal means can move in one direction or the other so as to cooperate alternatively with the container positioned on the right or with the container positioned on the left.

According to a variant the movable carriage is equipped with two withdrawal means, which are fitted advantageously at its front and at its rear and cooperate with one or both the rows of containers.

The withdrawal means is inserted into the container so as to cooperate with the support to be withdrawn and is then retracted to withdraw that support from the container and to bring the support to a substantially central position on the movable carriage.

The movable carriage is equipped with means able to check the position of the next support to be withdrawn from the container, so that the withdrawal means is automatically positioned vertically so as to coincide with the relative support to be withdrawn.

Where the containers are arranged in two parallel rows, the withdrawal means has at each end of its length a withdrawal position; these two withdrawal positions are spaced apart vertically by a vertical step of the container.

Thus once a support has been withdrawn from one container, it is possible to withdraw a support from the opposite container without having to re-lower the withdrawal means.

An engagement and laying means is also fitted to the movable carriage and takes the support with its relative green-tape foil from the withdrawal means and lays it on a conveyor positioned below and advancing step by step.

Where there are two parallel rows of containers, the containers are arranged advantageously in sequence alternately in one row and the other row, and therefore the cycle of withdrawal and conveying of the supports is continuous.

In fact, while the withdrawal means cooperates with one of the two opposed containers, the engagement and laying means cooperates with the conveyor, which moves forwards the supports thus laid that feed the successive processing stations continuously.

By means of the device according to the invention it is therefore possible to achieve a high output with the assembly line of the multi-layer green-tape circuits since downtimes are practically eliminated or at least reduced to a minimum.

According to a variant the assembly plant contains at least two first conveyor lines which are advantageously, but not necessarily, substantially parallel, each line cooperating with at least one row of containers. In this case the first conveyor lines discharge the relative supports in a desired sequence on a second conveyor line, which runs in a direction substantially perpendicular to the two first conveyor lines and cooperates with the end part of the same.

The second conveyor line conveys the supports bearing the relative green-tape foils to the next processing station or to the various successive processing stations.

According to a further variant a plurality of second conveyor lines is included.

The supports are kept in position advantageously on the conveyor by creating a negative pressure below the lower faces of the supports.

The conveyorconveys the supports, one by one, to a pre-alignment station in which the supports are aligned laterally.

According to a variant, so as to prevent lengthwise and/or crosswise tensions being created in the multi-layer pack of green-tape foils, one support in every given number of supports cooperates, downstream of the pre-alignment station, with a rotation station, in which the support is rotated by 90° on the plane on which it lies.

According to another variant the rotation station is located upstream of the pre-alignment station.

The green-tape foil is now sent to a removal station, in which it is removed from its respective support.

So as to assist removal from the support, at least a part of the support advantageously contains a plurality of small through holes, through which a jet of air is blown to lift the green-tape foil.

The green-tape foil, when removed from its own support, is sent to an alignment station, in which it is oriented lengthwise, crosswise and angularly on a substantially horizontal plane on the basis of appropriate signs, openings or other identification marks which it includes.

This alignment station may advantageously be of a known type which employs one or more telecameras and a table able to move on a plane on three axes.

When the green-tape foils have been removed, the empty supports are then sent to a store of supports for subsequent re-use.

According to a variant the green-tape foils removed from the relative supports are sent to an intermediate station.

The single green-tape foils are then sent to a superimposing and anchorage station, in which the green-tape foils are positioned, one on another according to their sequence of arrival, to form a multi-layer pack.

In the superimposing station the step of anchoring the foils to each other is carried out, for instance with an adhesive, or with the anchorage method disclosed in Italian patent application No. UD91A000156 filed in the name of the present applicant, or with any other anchorage system such as microwave welding or ultrasonic welding, for instance.

The multi-layer pack, when formed, is laid on a discharge and delivery means, which lays the pack on a carrier plate that cooperates with a discharge line.

The discharge and delivery means is advantageously, but not necessarily, of the type disclosed in Italian patent application No. UD91A000157 filed in the name of the present applicant.

Each of the carrier plates with its relative multi-layer pack of green-tape foils is now vacuum-packed in a sealed plastic bag and is then sent to a lamination step.

According to a variant the multi-layer packs of green-tape foils are removed from their respective carrier plates and sent to a successive compression step.

By means of the device according to the invention it is possible to produce automatically multi-layer packs consisting of a limitless number of green-tape foils, thus obviating the manual handling of the green-tape foils and the possibility of faults in the superimposing and/or alignment.

Moreover, the device according to the invention has a very high output and a limited bulk depending substantially on the number of green-tape foils constituting a multi-layer pack and therefore on the number of containers positioned side by side and required for that number of foils.

BRIEF DESCRIPTION OF THE DRAWINGS

The attached figures are given as a non-restrictive example and show some preferred embodiments of the invention as follows:

FIG. 1 is a plan view of a first form of embodiment of the device according to the invention;

FIG. 2 is a side view of the device of FIG. 1;

FIG. 6 shows a lengthwise section of the device of FIG. 1 along the line A—A;

FIG. 7 is a plan view of a support employed by the device according to the invention;

DETAILED DESCRIPTION OF PREFERRED EMBODIMENTS

Figure 3:
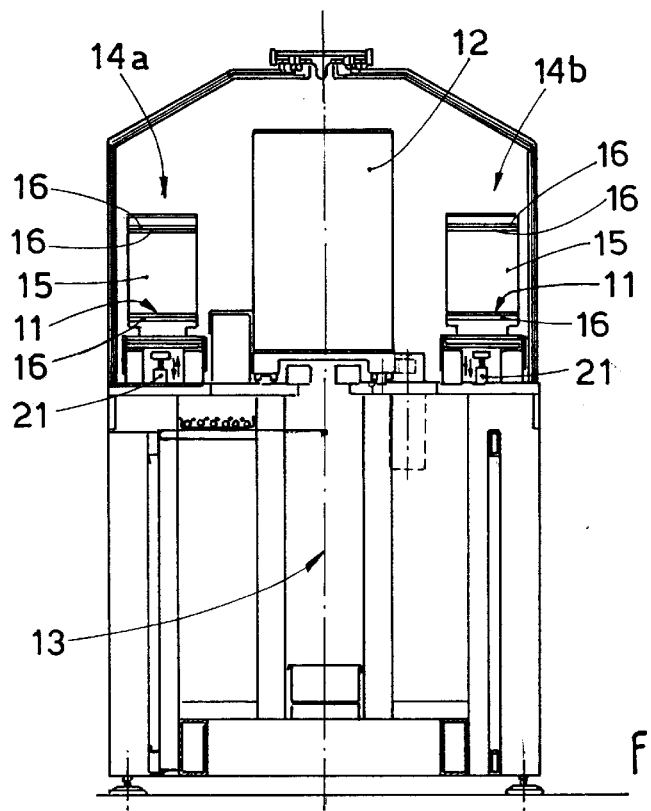
FIG. 3 is a front view of the device of FIG. 1.

In the attached figures the reference number 10 indicates generally a device that withdraws, superimposes and anchors on each other foils 11 for green-tape circuits according to the invention.

In the example of FIG. 1 the device 10 according to the invention comprises a movable carriage 12 able to run along a central lane 13 defined by two rows 14, a righthand row 14a and a lefthand row 14b respectively, of containers 15.

The containers 15 hold a plurality of plate-type supports 16, each of which bears a green-tape type foil 11; the supports 16 are stacked and suitably separated, one above another, with their lateral edges cooperating with two grooves 17 contained in inner surfaces 18a of sidewalls 18 of the containers 15.

The supports 16 may consist of plates of alumina, iron, stainless steel, plastic or any other material suitable for the purpose.

Each of the containers 15 has a lower base consisting of a pallet 57 and also an upper cover 58; the pallet 57 and cover 58 are connected together by the two sidewalls 18. In this example the cover 58 is secured to the sidewalls 18 by fixture screws 72.

In this case the pallet 57 comprises identification plaques 59 and recesses 74 for signalling and identification means.

The pallet 57 also contains a central space 75. Moreover, the outer surface of the base 60 of the pallet 57 is equipped in a personalised manner so as to cooperate with particular conveyor systems, which in this case consist of feeder conveyor belts 23.

In this case the pallet 57 has a substantially square shape but can also have a rectangular shape in which the long sides are suited to the short sides, as required.

Two holes 61 are contained in the cover 58 and cooperate with a handle, which is not shown here but is clamped by being merely rotated when its ends have been introduced into the holes 61, so that the container 15 can be handled manually.

In this example alignment means 70 are included on the cover 58 and consist, for instance, of an alignment hole 71 employed for correct positioning of possible means to lift the container 15 in the event that the containers 15 have to be engaged and conveyed by automatic means, which are not shown here.

Guide recesses 65 are included in the lower end part of the sidewalls 18 of the container 15 and cooperate with guide rails 64 present in the upper face of the pallet 57. Guide slots 62 are machined in the guide rails 64 and cooperate with clamping screws 63 acting on the sidewalls 18, thus enabling the pallet 57 and the sidewalls 18 to be correctly positioned and reciprocally secured.

By means of this system it is possible to position the sidewalls 18 readily in a plurality of undetermined positions in relation to each other and to the pallet 57.

The sidewalls 18 contain in their inner surfaces 18a grooves 17, which in cooperation with grooves 17 in the opposite sidewall 18 enable the supports 16 to be upheld, positioned and oriented.

The grooves 17 may be open at both their ends, as in this example, or may have one end blocked.

The open ends of the grooves 17 include lead-ins 66 to assist insertion of the supports 16 into the container 15.

In this example the lead-ins 66 consist of a bevel machined in the sidewalls 18 in correspondence with the grooves 17.

The open ends, at least in one side of the container 15, are closed by mechanical closure means 19 which can be momentarily rendered inactive.

In this example the mechanical closure means 19 includes a guide rod 67, about which the mechanical closure means 19 can rotate, and resilient return means 73 consisting of a spring.

The mechanical closure means 19 comprises also a closure lip 68 which obstructs the free end of the groove 17.

In this case there is one single mechanical closure means 19, which obstructs all the grooves 17 on one side of the sidewall 18, but there may be two or more mechanical closure means 19 which can be actuated independently or independently and simultaneously. Actuation can be carried out by hand or automatically.

In this case a downwardly protruding actuation pin 69 is provided for automatic actuation of the mechanical closure means 19; the method of working of this pin 69 will be described better hereinafter.

Projections, levers, etc. or other systems suitable for the purpose can be included instead of the actuation pin 69.

The rigid supports 16 (see FIG. 7) contain openings 54 to disclose the presence of green-tape foils 11 and also a plurality of small holes 55 arranged in a part of the surface of the support 16; the purpose of the small holes 55 will be described hereinafter.

The containers 15 are characterized according to the type of green-tape foil 11 which they hold.

The containers 15 have open at least their face turned towards the movable carriage 12 so that the supports 16 can be withdrawn from the containers 15.

The mechanical closure means 19 in this example can be actuated by an opener protrusion 20 fitted to the movable carriage 12 and driven by a cylinder/piston actuator, for instance.

In this case the containers 15 are fed in a pre-set, well-determined sequence to the device 10 according to the invention by two feeder conveyors 22, namely a righthand feeder conveyor 22a and a lefthand feeder conveyor 22b respectively. The respective feeder conveyors 22a–22b cooperate terminally with conveyor belts 23, namely a righthand belt 23a and a lefthand belt 23b respectively, which extend lengthwise parallel along the whole length of the device 10.

With the belts 23 there cooperate retractable means 21 that position and anchor the containers 15, which are thus positioned at determined points to form righthand 14a and lefthand 14b rows 14 respectively.

In this case a double withdrawal means 24 including a horizontal slider is fitted to the movable carriage 12 and can move in a horizontal plane in a direction perpendicular to the direction of advance of the movable carriage 12; this withdrawal slider means 24 cooperates with the supports 16 positioned in the relative containers 15 opposite momentarily to the movable carriage 12.

In this example, as there are two rows 14 of opposed containers 15, the withdrawal slider means 24 with the horizontal slider is traversed alternately to the right and left so as to withdraw supports 16 positioned in the corresponding containers 15 in the righthand 14a and lefthand 14b rows 14 respectively.

In this case the withdrawal slider means 24 with the horizontal slider has at each end of its length a withdrawal position, namely a first position 24a and a second position 24b respectively; these first 24a and second 24b withdrawal positions being spaced apart vertically by one vertical layer of the container 15.

By means of this lay-out it is possible to withdraw one support 16 from one container 15 by means of the first withdrawal position 24a and thereafter another support 16 from the opposite container 15 by means of the second withdrawal position 24b without having to re-position the withdrawal slider means 24 vertically.

The withdrawal slider means 24 cooperates with a first vertical positioner means 25 consisting, for instance, of a cylinder/piston actuator, which positions the withdrawal slider means 24 vertically substantially in coincidence with the lowest support 16 positioned at the bottom of the stack of supports 16 in the container 15.

Figure 5A:
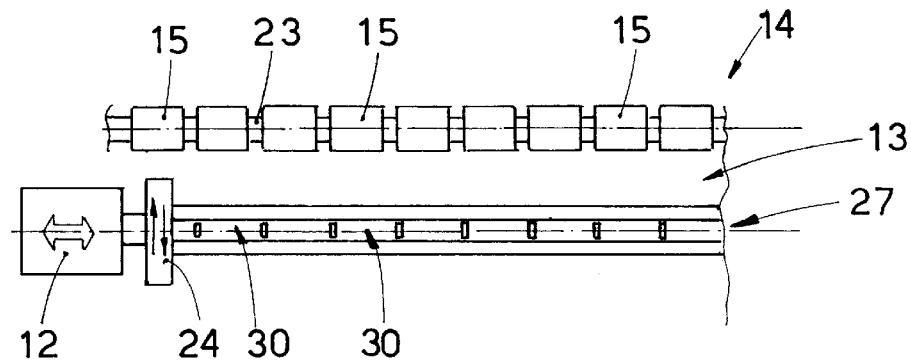
FIGS. 5a through 5d are diagrammatic plan views of four possible variants of the device of FIG. 1.

According to a variant (see FIG. 5a) the device 10 according to the invention includes containers 15 positioned side by side in one row 14, and the withdrawal slider means 24 is single.

According to another variant (see FIGS. 5b–5c) the movable carriage 12 is equipped with two withdrawal slider means 24 positioned upstream and downstream respectively of the movable carriage 12.

Figure 5B:
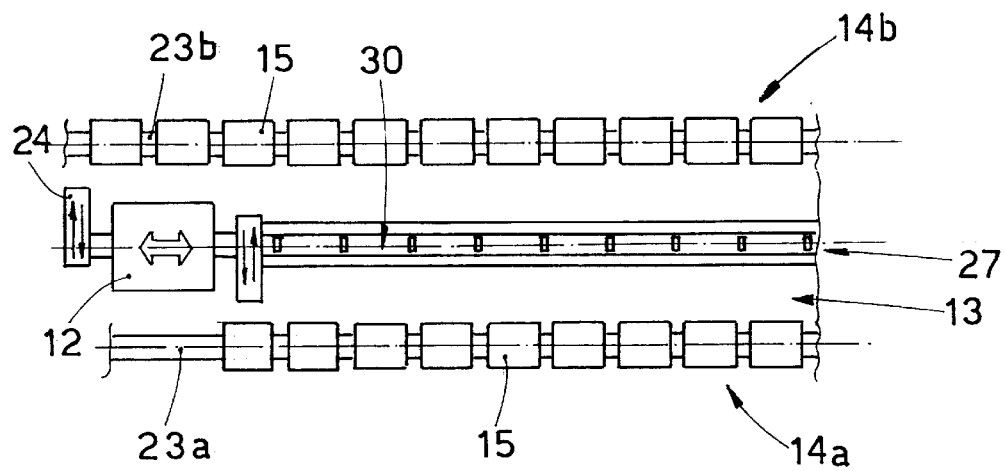

In the example of FIG. 5b the withdrawal slider means 24 are of a single type, each of them cooperating with containers 15 positioned in the corresponding row 14.

Figure 5C:
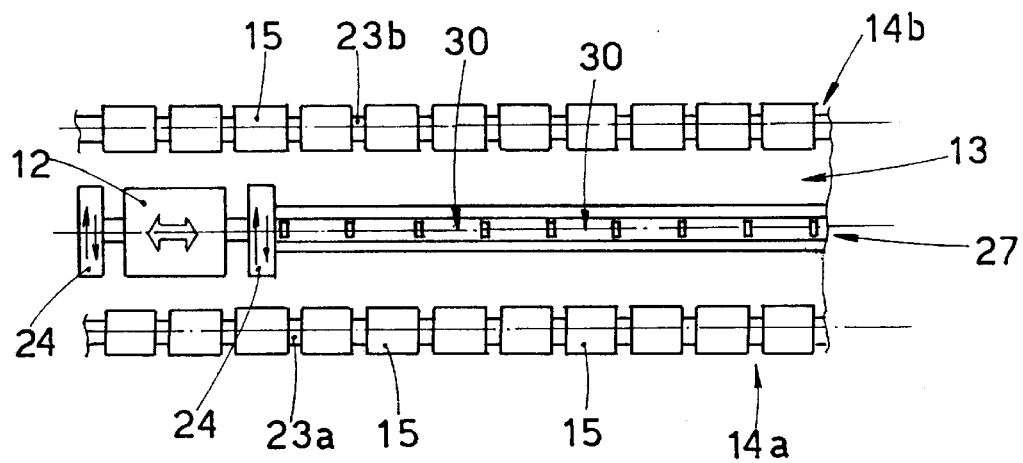

In the example of FIG. 5c the withdrawal slider means 24 are of a double type, each of them cooperating alternately with containers 15 positioned either in the righthand row 14a or the lefthand row 14b.

Figure 5D:
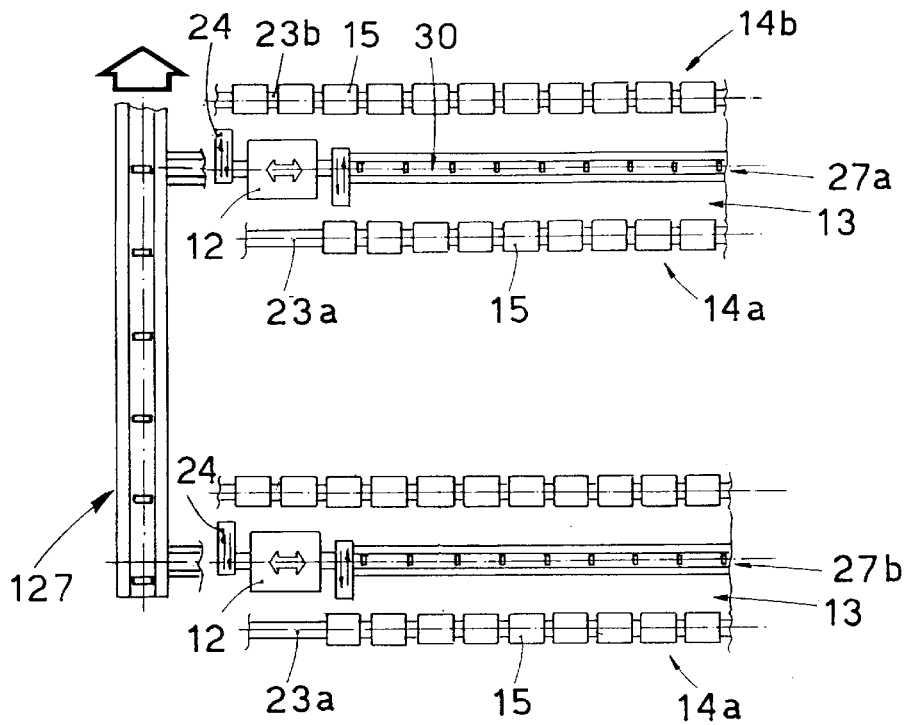
Figure 9:
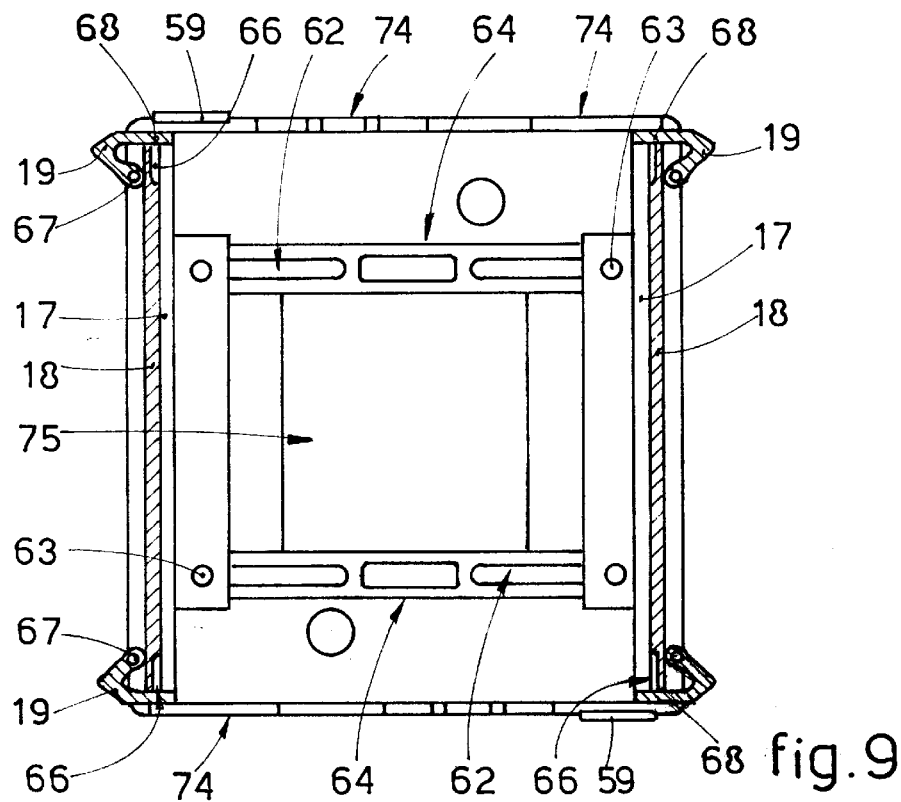
FIG. 9 shows a horizontal section of the container along the line B—B of FIG. 8.
Figure 8:
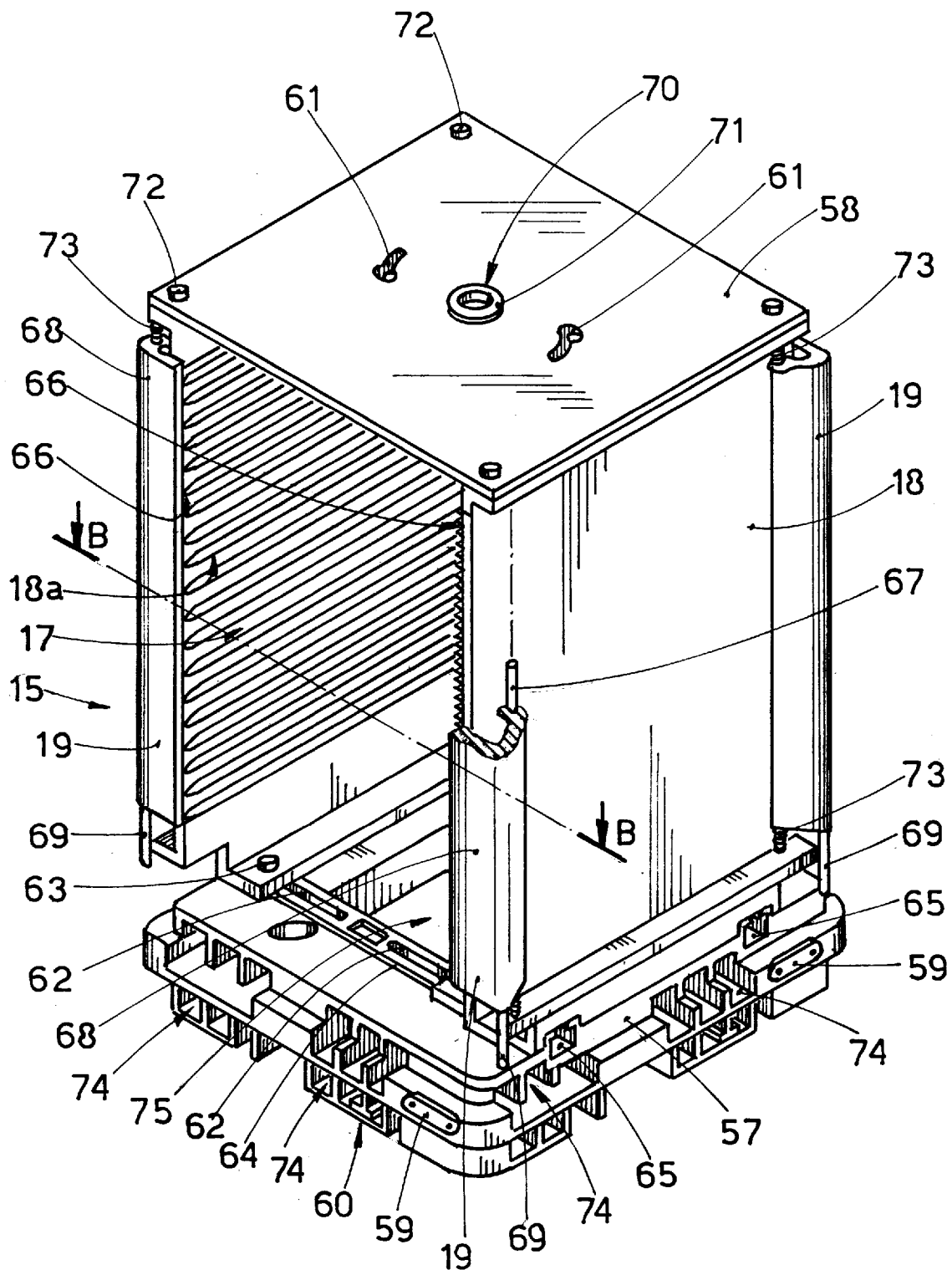
FIG. 8 is a three-dimensional view of a container according to the invention.

According to a further variant of FIG. 5d the assembly plant contains at least two first conveyor lines 27a–27b, which advantageously, but not necessarily, are substantially parallel, each of them cooperating with at least one row 14 of containers 15.

In this example each first conveyor line 27a–27b cooperates with two rows 14a–14b of containers 15; these first conveyor lines 27a–27b discharge in a desired sequence the relative supports 16 onto a second conveyor line 127, which runs in a direction substantially perpendicular to the two first conveyor lines 27a–27b and cooperates with the ends of the same 27a–27b.

The second conveyor line 127 conveys the supports 16 bearing the relative green-tape foils 11 to a successive processing station or to various successive processing stations, which are not shown here.

According to yet another variant more than one second conveyor lines 127 are included.

The arrangement of the containers 15 in the rows 14 will depend on the type and number of the withdrawal slider means 24 positioned on the movable carriage 12 and on the pre-set withdrawal sequence.

An engagement and laying means 26 is fitted on the movable carriage 12 in cooperation with the withdrawal slider means 24 and engages the support 16 together with the relative green-tape foil 11 positioned momentarily at the substantial centre of the withdrawal slider means 24 and lays the support 16 on the first conveyor line 27.

The first conveyor lines 27 can move step by step, feeds the supports 16 step by step and includes seats 30 for the supports 16; these seats 30 are advantageously set momentarily under negative pressure to hold the supports 16 in position.

The engagement and laying means 26 consists in this case of a gripper 28 fitted to a second vertical positioner means 29, which in turn is installed on a first vertical positioner means 25.

The gripper 28 can be moved and positioned on a substantially horizontal plane, by a first cylinder/piston actuator 31 for instance, along the axis of movement of the first conveyor line 27.

When a support 16 from the first righthand container 15a has been laid on the first conveyor line 27, the first conveyor line 27 is moved forward by one step, and then a support 16 from the first lefthand container 15b facing the first righthand container 15a is laid on the first conveyor line 27.

The movable carriage 12 is then advanced and is halted between the next two containers 15, and the above operations are repeated until the carriage 12 reaches the end of the rows 14.

The movable carriage 12 is now reversed until it is again positioned in front of the first two containers 15 of the rows 14, and the first vertical positioner means 25 is raised to bring the withdrawal slider means 24 to the plane on which the next supports 16 are lying.

The above withdrawal, engagement and laying cycle for the supports 16 on the first conveyor line 27 is repeated until the containers 15 have been emptied.

The first conveyor line 27 conveys every support 16 bearing its relative green-tape foil 11 to cooperate with a pre-alignment station 32, in which the lateral sides of the supports 16 are made to cooperate with positioner means 33 actuated in this case by second cylinder/piston actuators 34, which are moved in a coordinated manner and position the support 16 transversely.

The first conveyor line 27 takes the support 16 forwards to reach a removal station 35, in which first removal means 36a are caused to cooperate with the green-tape foil 11.

The first removal means 36a consist of a first flat plate 37a movable vertically by a third cylinder/piston actuator 50a; the lower flat surface of the first flat plate 37a is kept at a negative pressure momentarily.

In this case the first removal means 36a are firmly fixed together with second removal means 36b and third removal means 36c to the end of a ball-bearing screw 38 and at the same distance apart.

The ball-bearing screw 38 is capable of a linear alternating to-and-fro movement in the direction of advance of the green-tape foils 11.

In the removal station 35 the seats 30 on the surface of the first conveyor line 27 are kept momentarily under negative pressure so as to retain the relative support 16 and prevent the support 16 being engaged by the first flat plate 37a, which too is under negative pressure.

Furthermore, air under pressure is blown upwards from below to assist removal of the green-tape foil 11 from the support 16 and, passing through the small through holes 55 in the support 16, lifts and distances the green-tape foils 11 from the support 16.

The first flat plate 37a thus engages the green-tape foil 11 thus momentarily constrained and, with actuation of the ball-bearing screw 38, takes the foil 11 to a rotation station 56.

Instead, the relative support 16 is taken to a first store 48a of supports positioned in this example below the plane of movement of the first conveyor line 27.

In the rotation station 56 one green-tape foil 11 in every two is rotated by 90° before undergoing an alignment step, so that a multi-layer pack 45 is obtained at the outlet in which the green-tape foils 11 are superimposed on each other after being rotated alternately by 90° on the plane on which they lie.

The green-tape foil 11, when rotated, is engaged by second removal means 36b consisting of a second flat plate 37b of which the flat lower surface is kept momentarily under negative pressure.

According to a variant the green-tape foils 11 are not rotated in the rotation station 56, which in this case acts as an intermediate station.

The second flat plate 37b engages the green-tape foil 11 thus momentarily constrained and takes it, by actuation of the ball-bearing screw 38, to an alignment station 39.

In this alignment station 39 the green-tape foil 11 is rested on the flat surface of a movable table 40, which too is kept momentarily under negative pressure and cooperates with a visual system consisting of two telecameras 41 placed substantially in correspondence with two reference marks on the green-tape foils 11, the marks advantageously being diametrically opposite each other.

The movable table 40 can be positioned lengthwise, crosswise and at an angle, thus enabling the green-tape foil 11 to be correctly aligned on the plane on which it lies.

In this case, for constructional reasons alone, the alignment station 39 is positioned off the axis of the direction of movement of the supports 16.

The green-tape foil 11 is then engaged by third removal means 36c consisting of a third flat plate 37c, the flat lower surface of which is kept momentarily under negative pressure.

The green-tape foil 11 is then laid in a superimposing and anchorage station 42, in which the first green-tape foil 11 is placed and left by the third flat plate 37c on a conveyor belt 43 of a transpirable type so that the green-tape foil 11 placed first can be retained in position.

The next green-tape foil 11 in turn is positioned on the first green-tape foil 11 and is kept in position by the third flat plate 37c until a welding unit 44 anchors the superimposed green-tape foil 11, advantageously with at least two welding points, to the preceding green-tape foil 11.

In this example the three flat plates 37a-37b-37c are fitted to the ball-bearing screw 38 and therefore are moved simultaneously in a horizontal direction, whereas their vertical positionings are independent of each other and are carried out by cylinder/piston actuators 50, namely third 50a, fourth 50b and fifth 50c actuators respectively.

As we said earlier, the anchorage method performed by the device 10 according to the invention can advantageously be that disclosed in Italian patent application No.UD91A000156 filed by the present applicant or any other known anchorage system.

The superimposing and successive welding operations are repeated until the required multi-layer pack 45 has been obtained.

In this example the conveyor belt 43 of a transpirable type is caused to run when the multi-layer pack 45 has been constituted, and thus delivers the multi-layer pack 45 to a discharge and delivery means 51 installed downstream. In this case the discharge and delivery means 51 is of the type disclosed in Italian patent application No.UD91A000157 filed in the name of the present applicant.

The discharge and delivery means 51 consists of a flat platform 52 able to move on a horizontal plane and driven by a sixth cylinder/piston actuator 53, which positions and discharges the multi-layer pack 45 on a carrier plate 46, which is positioned below and arrives from a second store 48b of supports and is positioned on a discharge conveyor 47.

This cycle of operations is repeated until the containers 15 have been emptied; thereafter the belts 23a-23b are actuated to distance and remove the empty containers 15 by means of respective right 49a and left 49b removal conveyors.

At the same time fresh containers 15 full of supports 16 and relative green-tape foils 11 are delivered by the respective right 22a and left 22b feeder conveyors.

Figure 4:
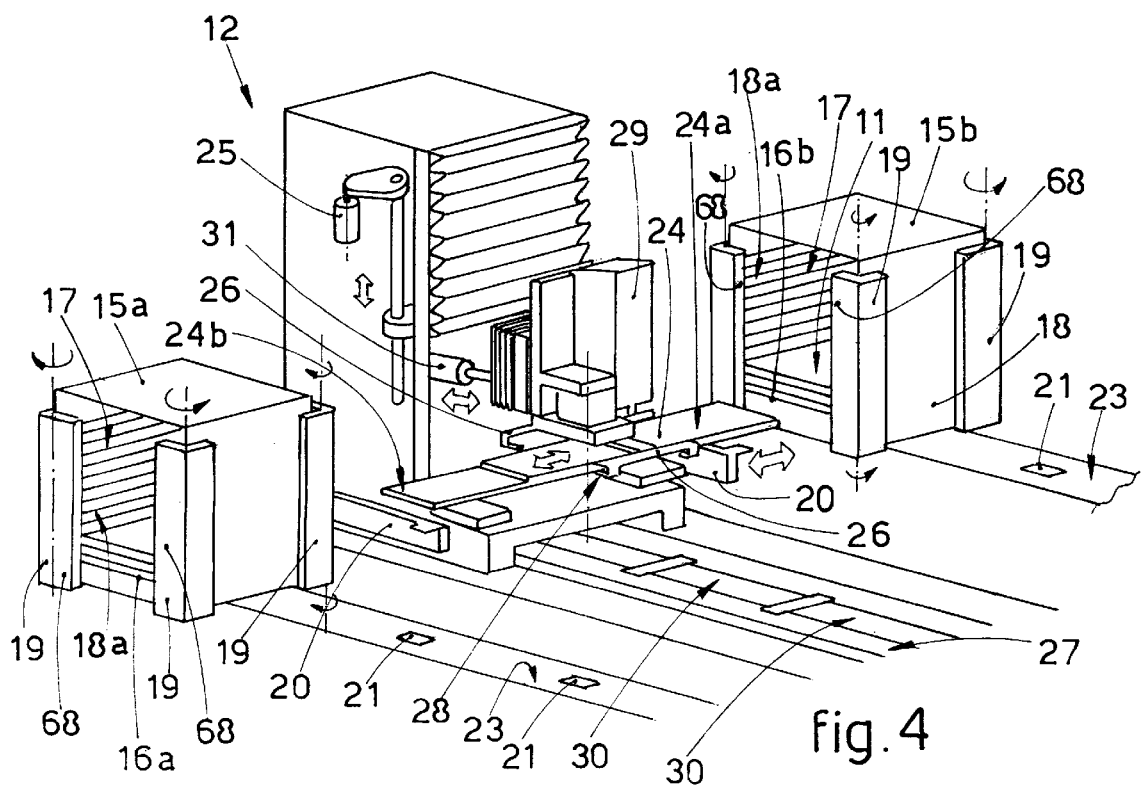
FIG. 4 is a three-dimensional view of the movable carriage of the device according to the invention in cooperation with two opposed containers.

We shall describe below, step by step, the various steps in the operation of engaging and laying the supports 16 from their respective containers 15 by means of the device 10 according to the invention shown in FIG. 4:

positioning of the movable carriage 12 opposite the facing containers 15a–15b;

actuation of the opener protrusion 20 which acts on the mechanical closure means 19 of the righthand and lefthand containers 15a–15b, thus freeing the supports 16 contained therein;

actuation of the first vertical positioner means 25 so as to position the withdrawal slider means 24 slightly below the plane on which the supports 16 to be withdrawn lie;

displacement of the withdrawal slider means 24 to the left to the first withdrawal position 24a of that means 24 in correspondence with the lefthand support 16b in the lefthand container 15b;

actuation of the first vertical positioner means 25 so as to make the first withdrawal position 24a cooperate with the lefthand support 16b, which is thus raised;

displacement of the withdrawal slider means 24 to the right so as to bring the second withdrawal position 24b at the righthand end of the withdrawal slider means 24 into correspondence with the righthand support 16a in the righthand container 15a;

actuation of the first vertical positioner means 25 so as to make the second withdrawal position 24b cooperate with the righthand support 16a, which is thus raised;

actuation of the engagement and laying means 26 to clamp in the gripper 28 the lefthand support 16b lying on the lefthand part of the withdrawal slider means 24, this lefthand part being positioned momentarily at the centre of the movable carriage 12;

actuation of the second vertical positioner means 29 so as to bring the lefthand support 16b to a high position;

displacement of the withdrawal slider means 24 to the left so as to bring the second withdrawal position 24b of the withdrawal slider means 24, upholding the righthand support 16a, into correspondence with the central median part of the movable carriage 12;

actuation of the first cylinder/piston actuator 31 to bring the gripper 28 forwards, and simultaneous actuation of the first vertical positioner means 25 so as to lower the gripper 28 to a height slightly above the conveyor line 27;

displacement of the withdrawal slider means 24 to the second withdrawal position 24b;

actuation of the engagement and laying means 26 so as to open the gripper 28 and lay the lefthand support 16b on the conveyor line 27;

actuation of the second vertical positioner means 29 so as to bring the righthand support 16a on the conveyor line 27;

actuation of the conveyor line 27, which advances by one position;

actuation of the second vertical positioner means 29 to bring the gripper 28 to its high position;

actuation of the first cylinder/piston actuator 31, which retracts the gripper 28;

actuation of the second vertical positioner means 29 to bring the gripper 28 to its engagement position;

actuation of the engagement and laying means 26 so as to clamp in the gripper 28 the righthand support 16a located in the second withdrawal position 24b of the withdrawal slider means 24;

actuation of the second vertical positioner means 29 to bring the gripper 28 to its high position;

actuation of the opener protrusion 20, which disengages the mechanical closure means 19 of the righthand 15a and lefthand 15*b* containers, and simultaneous actuation of the withdrawal slider means 24, which brings the slider to its central position, while the first cylinder/piston actuator 31 advances the gripper 28;

actuation of the second vertical positioner means 29 to bring the gripper 28 to its laying position;

actuation of the engagement and laying means 26 to open the gripper 28 and to lay the righthand support 16*a* on the conveyor line 27;

actuation of the second vertical positioner means 29 to bring the gripper 28 to its high position, while the first vertical positioner means 25 returns to the engagement position;

actuation of the first cylinder/piston actuator 31, which retracts the gripper 28;

actuation of the movable carriage 12 to position itself in correspondence with the next containers 15*a*–15*b*, and repetition of the above cycle.

What is claimed is:

1. Device to withdraw, superimpose and anchor foils for green-tape circuits, said device comprising:

a plurality of containers of supports of a single type green-tape foil, each container holding green-tape foils of one type, each container having at least one withdrawal side that can be rendered temporarily unusable by closure means, a movable conveyor means for transporting said green-tape foils, said containers are arranged at least along one side and cooperating with said conveyor means;

movable carriage means for withdrawing the supports in a programmed manner, the conveyor means cooperating at least with means for withdrawing the green-tape foils from the supports and and moving the green-tape foils past a support discharge station, an alignment station and a superimposing and anchoring station, wherein said support discharge station includes support discharge means for discharging said supports from said green-tape foils, said alignment station comprises alignment means for aligning said green-tape foils and said superimposing and anchoring station comprises superimposing and anchorage means for superimposing a predetermined number of green-foil tapes one upon the other and anchoring said superimposed tapes to one another.

2. Device as in claim 1, in which the movable carriage means (12) include opener means (20) to render the closure means (19) inactive momentarily.

3. Device as in claim 1, in which the movable carriage means (12) include slider means (24) for the programmed withdrawal of supports (16) from the containers (15) and also engagement means (26) to lay supports (16) on the conveyor means (27).

4. Device as in claim 1, in which the movable carriage means (12) include means (29) for the vertical positioning of the withdrawal slider means (24).

5. Device as in claim 1, in which the movable carriage means (12) include withdrawal slider means (24) able to move towards the containers (15) and governed by means for the lifting and engaging of supports (16) within the containers (15).

6. Device as in claim 1, in which the movable carriage means (12) comprise gripper means (28) to take supports (16) from the withdrawal slider means (24) and to lay those supports (16) on the conveyor means (27).

7. Device as in claim 1, in which the withdrawal slider means (24) comprise at each end of their length a withdrawal position (24*a*–24*b*), these two withdrawal positions (24*a*–24*b*) being vertically spaced apart by one vertical layer of the container (15).

8. Device as in claim 1, in which the conveyor means (27) advances step by step.

9. Device as in claim 1, in which the alignment means (39) comprise a table (40) able to move on a horizontal plane on three axes and governed by at least one telecamera (41) which detects identification marks on the green-tape foils (11).

10. Device as in claim 1, in which rotation means (56) rotate by 90° one foil in every pre-set number of green-tape foils (11).

11. Device as in claim 1, in which the green-tape foil (11) is anchored at least to the preceding green-tape foil (11) in a superimposing and anchorage station (42).

12. Device as in claim 1, in which discharge conveyor means (47) are included downstream of the superimposing and anchorage station (42).

13. Device as in claim 1, in which the empty supports (16) are collected in a first store (48*a*) for supports positioned below the plane of movement of the conveyor means (27).

14. Device as in claim 1, in which carrier plates (46) for packs of the foils (11) are taken from a second store (48*b*) of supports positioned below the plane of movement of the discharge conveyor means (47).

15. Device as in claim 1, in which the supports (16) contain holes (54) to show the presence of green-tape foils (11) and also small holes (55) for the clamping and movement of green-tape foils (11).

16. Device as in claim 1, in which the containers (15) include a pallet (57) with the outer surface of its base (60) equipped in a personalized manner for cooperation with the specific conveyor systems, the pallet (57) including identification means (59) and means (74) for application of signalling and identification means, the pallet (57) being rigidly connected also to two sidewalls (18) of the container (15), these sidewalls (18) containing grooves (17) in their opposed surfaces (18*a*), the inner surface of the pallet (57) containing guide slots (62) cooperating with small plates and clamping screws (63) for reciprocal fixture of the sidewalls (18) to the pallet (57) in desired positions not determined beforehand.

17. Device as in claim 1, in which the container (15) includes a pallet (57) containing a central space (75).

18. Device as in claim 1, in which the container (15) includes a cover (58) with means (61) for fixture of a handle.

19. Device as in claim 1, in which the container (15) comprises a cover (58) with alignment means (70).

20. Device as in claim 1, in which the container (15) comprises interception means consisting of mechanical closure means (19), which close resiliently at least one end of the grooves (17) and can be rendered inactive momentarily, at least one mechanical closure means (19) being included in at least one side of the container (15), the mechanical closure means (19) including actuation pin means (69).

21. Device to withdraw, superimpose and anchor foils for green-tape circuits, which is employed to pre-arrange multi-layer circuits that comprise a plurality of green-tape foils superimposed on each other in an ordered sequence, pressed and thereafter welded, said device including:

a conveyor line having at least one side;

a plurality of containers located in cooperation with said at least one side of the conveyor line, each container holding a plurality of green-tape foils, each of said foils individually supported by a vertically spaced support, the green-tape foils of a specific container being of the same type, each of the containers having at least one withdrawal side facing towards the conveyor line;

access control means for controllably preventing access to each of said containers;

carriage means movable along the conveyor line including bearing means for withdrawing supports from the containers and for laying said supports on the conveyor line;

an opener protrusion associated with the movable carriage and cooperable with the access control means to permit temporary access to the container by said means for withdrawing supports, said movable carriage means cooperating with the containers in accordance with a programmed sequence for the withdrawal of at least one support at a time and laying the at least one withdrawn support on the conveyor line;

a pre-alignment station along said conveyor line downstream of said carriage means;

a removal station along said conveyor line downstream of said pre-alignment station;

a rotation station, adjacent said removal station and along said conveyor line and downstream of said removal station;

an alignment station along said conveyor line and downstream of said rotation station;

a superimposing and anchorage station comprising a means for stacking and interconnecting the green-tape foils; and a discharge and delivery means for discharging said stacked and interconnected green-tape foils.

* * * * *